United States Patent
Classon

(10) Patent No.: US 6,324,668 B1
(45) Date of Patent: Nov. 27, 2001

(54) METHOD, COMMUNICATION SYSTEM, PHONE, AND RADIO TRANSMITTER UTILIZING NONSYSTEMATICALLY SHORTENED CODE ENCODER AND DECODER

(75) Inventor: Brian Keith Classon, Streamwood, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/109,161

(22) Filed: Jun. 30, 1998

(51) Int. Cl.$^7$ .................................................. H03M 13/03
(52) U.S. Cl. ................................................................ 714/783
(58) Field of Search .................................... 714/783, 794, 714/780, 781, 758, 796, 752, 800, 807, 746, 712; 341/143; 375/262, 341, 285; 704/219, 222, 230, 242; 358/463, 461; 706/16, 34

(56) References Cited

U.S. PATENT DOCUMENTS

| | | | |
|---|---|---|---|
| 4,389,677 | 6/1983 | Rushby et al. | 358/463 |
| 4,397,022 | 8/1983 | Weng et al. | 714/783 |
| 4,414,667 | 11/1983 | Bennett | 714/783 |
| 4,613,860 | 9/1986 | Currie et al. | 340/825.57 |
| 4,623,999 | * 11/1986 | Patterson | 714/759 |
| 4,648,091 | * 3/1987 | Gaijar | 714/783 |
| 4,926,169 | 5/1990 | Tong et al. | 340/825.57 |
| 4,933,956 | * 6/1990 | Forney, Jr. | 375/341 |
| 5,140,596 | * 8/1992 | Weldon, Jr. | 714/762 |
| 5,493,584 | * 2/1996 | Emeott | 375/224 |
| 5,548,684 | 8/1996 | Wang et al. | 706/16 |
| 5,606,569 | 2/1997 | MacDonald et al. | 714/758 |
| 5,926,488 | * 7/1999 | Khayrallah | 714/783 |
| 5,944,842 | * 8/1999 | Propp et al. | 714/701 |
| 5,953,378 | * 9/1999 | Hotani et al. | 375/341 |
| 5,968,199 | * 10/1999 | Khayrallah et al. | 714/783 |
| 5,991,901 | * 11/1999 | Muldord et al. | 714/704 |
| 6,189,125 | * 2/2001 | Classon | 714/783 |

OTHER PUBLICATIONS

Shu Lin and Daniel J. Costello, Jr. "Error Control Coding," pp. 95–98, and pp. 116, 117, Copyright 1983 by Prentice–Hall Inc.

Amrani, Ofer, Yair Be'ery, Alexander Vardy, Feng–Wen Sun, and Henk C.A. van Tilborg, "The Leech Lattice and the Golay Code: Bounded–Distance Decoding and Multilevel Constructions", IEEE Transactions on Information Theory, vol. 40, No. 4, Jul. 1994, pp 1030–1043.

Vardy, Alexander, "Even More Efficient Bounded–Distance Decoding of the Hexacode, the Golay Code, and the Leech Lattice", IEEE Transactions of Information Theory, vol. 41, No. 5, Sep. 1995, pp 1495–1499.

Vardy, Alexander and Yair Be'ery, "More Efficient Soft Decoding of the Golay Codes", IEEE Transactions of Information Theory, vol. 37, No. 3, May 1991, pp. 667–672.

(List continued on next page.)

*Primary Examiner*—Albert Decady
*Assistant Examiner*—Guy Lamarre
(74) *Attorney, Agent, or Firm*—Daniel K. Nichols

(57) ABSTRACT

A method 400, phone 203, radio transmitter 205, and communication system 200 including a nonsystematically shortened code encoder 202 having an input 204 adapted to receive input digital signals having a number of bits, the nonsystematically shortened code encoder 202 is adapted to produce encoded shortened code digital signals in accordance with the input digital signals. The communication system further including a nonsystematically shortened code decoder 208 adapted to receive the encoded shortened code digital signals, wherein the nonsystematically shortened code decoder 208 is adapted to produce an estimate of the input digital signals and an error detection flag.

18 Claims, 3 Drawing Sheets

OTHER PUBLICATIONS

Lin, Shu and Daniel J. Costello, Jr. "Error Control Coding Fundamentals and Applications", Prentice–Hall, Inc. Englewood Cliffs, New Jersey, pp 65–68.

Costello, Daneil J., "Construction of Good Convolutional Codes", Prentice–Hall, Inc., Englewood Cliffs, New Jersey, 1983, p. 329.

Vardy, et al. (More Efficient Soft Decoding of the Golay Code, IEEE, Sep. 1991).*

Solomon, (Convolutional Encoding of Self–Dual Codes, IEEE, 1994).*

Coulton, et al. (Application of Turbo Codes to HF Data Transmission, IEEE, 1997).*

Honary, et al. (New Simple Encoder and Trellis Decoder for Golay Codes, IEEE, 1993).*

Conway, et al. (Orbit and Coset Analysis of the Golay and Related Codes, IEEE, 1990).*

Solomon, G (Convolutional encoding of self–dual codes; IEEE, Jun. 27–Jul. 1, 1994).*

* cited by examiner

METHOD, COMMUNICATION SYSTEM, PHONE, AND RADIO TRANSMITTER UTILIZING NONSYSTEMATICALLY SHORTENED CODE ENCODER AND DECODER

RELATED INVENTIONS

The present invention is related to the following inventions which are assigned to the same assignee as the present invention:

"METHOD, SYSTEM, APPARATUS, AND PHONE FOR ERROR CONTROL OF GOLAY ENCODED DATA SIGNALS", having Ser. No. 09/109,349 filed on Jun. 30, 1998, now U.S. Pat. No. 6,199,189 concurrently herewith.

"METHOD, COMMUNICATION SYSTEM, AND PHONE FOR SYSTEMATIC ENCODING AND COMPUTATIONALLY EFFICIENT DECODING FOR MINIMIZING ERROR PROPAGATION", having Ser. No. 09/106/875 filed on Jun. 30, 1998, now U.S. Pat. No. 6,189,125 concurrently herewith.

The subject matter of the above-identified related inventions are incorporated by reference into the disclosure of the present invention.

FIELD OF THE INVENTION

The present invention generally relates to a method and communication system utilizing a nonsystematically shortened code encoder and decoder, and more particularly to a method and communication system utilizing a nonsystematically shortened Golay code encoder and decoder for efficient error correction and detection.

BACKGROUND OF THE INVENTION

It is well known that channel coding can provide error correction capability, error detection capability, or both. A channel decoder that can detect errors passes this information to an error handling routine, which typically either signals for retransmission of an erroneous block of data, or attempts some form of error concealment.

The simplest and by far most commonly used method for joint error detection and correction is to use a concatenation of two codes: a cyclic redundancy check (CRC) error detection code to provide error detection on the information bits, and an error correction code to provide error correction on both the information bits and the CRC bits. Thus, the use of a CRC generally provides for the detection of any errors that remain after error correction. This method does not use a single code and a decoder which can both correct and detect errors. This method does not offer the advantage of error detection without the overhead of a CRC, and does not base both the correction and detection on the soft inputs (a CRC accepts only hard inputs), when soft inputs are available.

(24,12) Golay code encoders and decoders based on the non-binary hexacode have been used in the communication systems for error handling. The family of hexacode-based Golay decoders is very valuable because of the low complexity involved in soft-decision decoding of the popular (24,12) Golay code. The hexacode-based Golay decoders can also accept hard inputs, and are less complex than other hard-decision Golay decoders. The drawback of the hexacode-based Golay decoders is that the Golay code must be represented in a very particular format. Encoding of information packets to be decoded with a hexacode-based Golay decoder is accomplished by a multi-level hexacode based Golay encoder, as described in a paper by O. Amrani, Y. Be'ery, A. Vardy, F. Sun, and H. van Tilborg entitled: "The Leech lattice and the Golay code: Bounded Distance Decoding and Multi-level Constructions", IEEE Trans. Inform. Theory, Vol. IT-40, pp. 1030–1043, July 1994. The multi-level Golay encoder is non-systematic, such that the input bits to the encoder do not appear within the output bits of the encoder. Non-systematic encoders cause a slightly worse decoded information bit error rate (BER) than systematic encoders due to error propagation.

Presently, the hexacode-based Golay decoders are used only for error correction. Thus there is a need for a communication system that provides for combination of error detection and error correction utilizing hexacode-based Golay decoders.

DETAILED DESCRIPTION OF A PREFERRED EMBODIMENT

Figure 1:
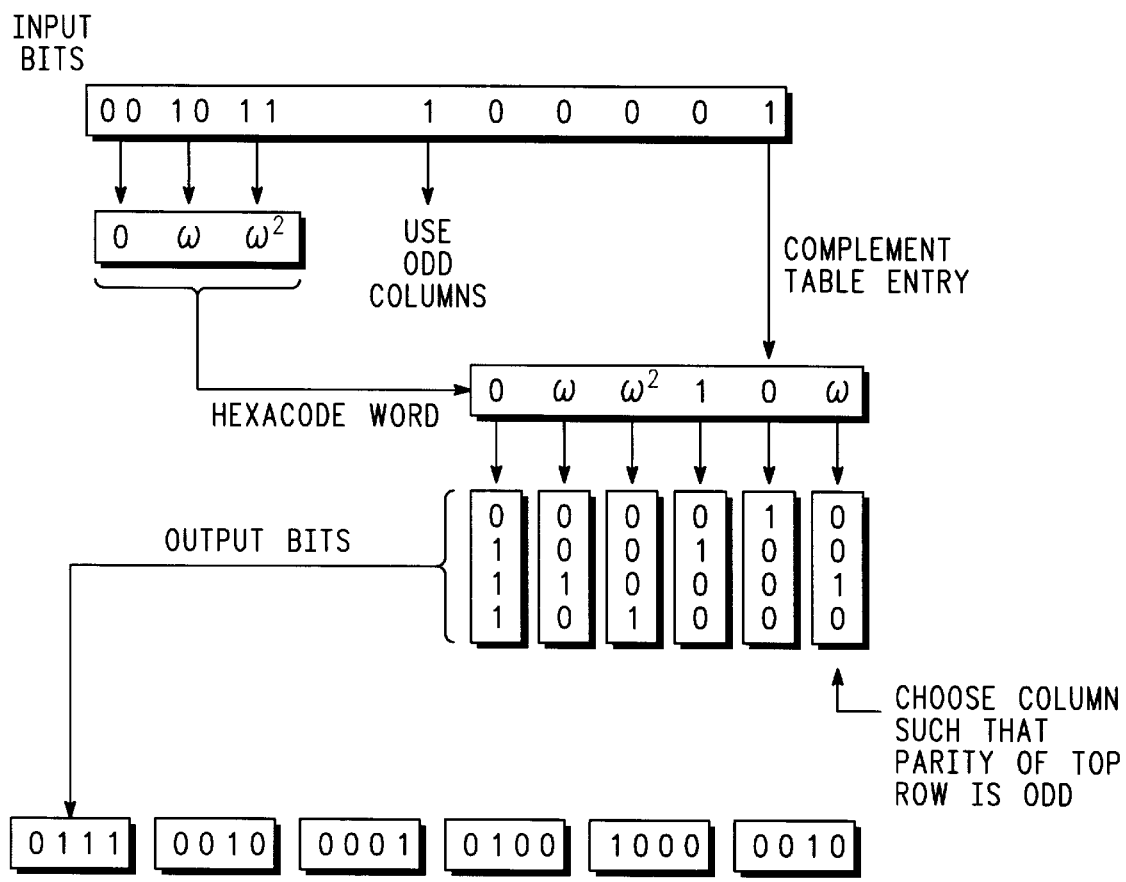
FIG. 1 is a flow diagram of a conventional mapping of 12 bits onto 24 bits using a hexacode-based multi-level Golay encoder.

The present invention provides for efficient correction and detection of input digital signal errors over a communications channel. The present invention in part utilizes a hexacode-based multi-level Golay encoder in combination with a hexacode-based Golay decoder to provide error correction and detection over the communications channel. Both of the hexacode-based multi-level Golay encoder and hexacode-based Golay decoder are based on a formulation referred to as an extended Golay code. The extended Golay code can be characterized as a (24,12) linear code consisting of all 4×6 binary matrices such that the following three conditions hold:

1. The parity of all the columns is the same. (All the columns have either an even or odd number of 1's.)
2. The parity of the columns equals the parity of the top row.
3. The projection of the 4×6 binary matrix onto a 1×6 non-binary array belongs to the (6,3) linear code known as the hexacode. The characters of the hexacode are derived from the Galois field $GF\{4\}=\{0,1,\omega,\omega^2\}$. Multiplication and addition tables for $GF\{4\}$ and a systematic generator matrix for the hexacode are shown hereinbelow:

Generator matrix for the hexacode $$\begin{bmatrix} 1 & 0 & 0 & 1 & \omega^2 & \omega \\ 0 & 1 & 0 & 1 & \omega & \omega^2 \\ 0 & 0 & 1 & 1 & 1 & 1 \end{bmatrix}$$

-continued

Addition and multiplication tables for $\mathcal{GF}(4)$

| + | 0 | 1 | $\omega$ | $\omega^2$ |
|---|---|---|---|---|
| 0 | 0 | 1 | $\omega$ | $\omega^2$ |
| 1' | 1 | 0 | $\omega^2$ | $\omega$ |
| $\omega$ | $\omega$ | $\omega^2$ | 0 | 1 |
| $\omega^2$ | $\omega^2$ | $\omega$ | 1 | 0 |

| × | 0 | 1 | $\omega$ | $\omega^2$ |
|---|---|---|---|---|
| 0 | 0 | 0 | 0 | 0 |
| 1 | 0 | 1 | $\omega$ | $\omega^2$ |
| $\omega$ | 0 | $\omega$ | $\omega^2$ | 1 |
| $\omega^2$ | 0 | $\omega^2$ | 1 | $\omega$ |

For example, using Galois field arithmetic, the data vector $(0\omega\omega^2)$ encodes to the hexacode word $(0\omega\omega^2 10\omega)$. A 4×6 Golay code matrix is projected onto a 1×6 array of characters in GF{4} by projecting each four bit column onto a single character. If the column is $(a_0 a_1 a_2 a_3)'$, wherein $a_0$ through $a_3$ represent binary values in a column, the corresponding character is calculated using the following projection formula: $0 \cdot a_0 + 1 \cdot a_1 + \omega \cdot a_2 \cdot \omega^2 \cdot a_3$. Projecting a column onto a character is a many-to-one mapping. For example, (0 0 0 0)', (1 1 1 1)', (0 1 1 1)', and (1 0 0 0)' all project onto the character "0".

An example of an encoding using a hexacode-based multi-level Golay encoder is described below:

Encoding example:

A hexacode-based multi-level Golay encoder receives 12 input bits and maps the same onto a 24 bit Golay codeword (the contents of a binary 4×6 matrix). The 24 bits of the matrix are then read out into the channel columnwise. Of the 12 input bits, bits 1 to 6 are used to select a hexacode word. Since the non-binary characters of GF{4} can be represented by two bits each, these six bits specify three characters of GF{4}. The (6,3) hexacode is utilized to take these three characters and produce a six character hexacode word. For example, if the first six input bits are (00, 10, 11), the corresponding three characters are $(0\omega\omega^2)$, given that 00=0, 01=1, 10=$\omega$, and 11=$\omega^2$. Using the generator matrix of the hexacode, $(0\omega\omega^2)$ is mapped to the hexacode word having six characters $(0\omega\omega^2 10\omega)$. The six characters are used to generate the six four-bit columns of the Golay code matrix, such that condition 3 of the definition of the extended Golay code described above holds. That is, each four-bit column must project onto its hexacode word character. In general, there are four possible columns with which each character can be replaced, since four different columns will project onto a single character. In terms of condition 3 of the extended Golay code definition described hereinbefore, any of the four columns may be used. In order to satisfy conditions 1 and 2, however, the remaining six input bits of the twelve input bits are used to make sure that all the columns used have either even or odd parity, and that the top row has the same parity as the columns. For example, it should be appreciated that the following series of bits in a column all project to the character "0": (0 0 0 0)', (1 1 1 1)', (0 1 1 1)', and (1 0 0 0)'. It should be noted that two of the possible columns have even parity, and the other two have odd parity. Also, the two even columns are complements of each other, as are the two odd columns. The above-mentioned conditions are also applicable when mapping characters 1, $\omega$, and $\omega^2$. Thus, input bit 7 is used to determine if all the columns will have even (i.e., bit 7=0) or odd (i.e., bit 7=1) parity. This guarantees that condition 1 of the extended Golay code definition will be satisfied. Given that the column is even or odd, each of the six characters can be represented by only two possible columns. Input bits 8 through 12 are used to determine which of the two remaining columns is preferred for the first five characters in the hexacode word. Input bits 8 through 12 are referred to as the "preference bits". The last character of the hexacode word must be represented by a column which provides the top row of the 4×6 matrix to have the same parity as the columns, as dictated by the values of bit 7, namely 1 or 0. A simple encoding table depicting the series of the binary values that correspond to the non-binary hexacode characters is shown in the TABLE A below:

TABLE A

| hexacode character | | | | | | | |
|---|---|---|---|---|---|---|---|
| 0 | 1 | $\omega$ | $\omega^2$ | 0 | 1 | $\omega$ | $\omega^2$ |
| 0 | 0 | 0 | 0 | 0 | 0 | 0 | 0 |
| 0 | 0 | 1 | 1 | 1 | 1 | 0 | 0 |
| 0 | 1 | 0 | 1 | 1 | 0 | 1 | 0 |
| 0 | 1 | 1 | 0 | 1 | 0 | 0 | 1 |
| even (bit 7 = 0) | | | | odd (bit7 = 1) | | | |

For a given hexacode character (0,1,$\omega$, and $\omega^2$), TABLE A provides for the determination of which column to be used. In determining which column to use for each hexacode character, the preference bit corresponding to the column must be considered. The above table is prepared with the assumption that the preference bit is 0; however, when the bit signifying the preference bit is 1, then the complement of the column represented in the table is chosen as representation of the hexacode character.

For example, the input vector (001011100001) is encoded as shown in the flow diagram shown in FIG. 1. The multi-level encoding construction shown in FIG. 1 satisfies the three conditions of the extended Golay code definition. The first six input bits are used to represent 3 characters from GF{4}. These three characters are used to produce a 6 character hexacode word. Each character of the hexacode word will be used to produce a four bit column of the Golay code represented as a 4×6 matrix. Input bit 7 is a 1, so each column will be an odd representation of the corresponding character. Input bit 8 is a 0, so the preference of the first column (output bits 1 to 4) is 0 and the column selected is (0 1 1 1)'. Input bit 9 is a 0, so the preference of the second column (output bits 5 to 8) is 0 and the column selected is (0 0 1 0)'. Input bit 10 is a 0, so the preference of the third column (output bits 9 to 12) is 0 and the column selected is (0 0 0 1)'. Input bit 11 is a 0, so the preference of the fourth column (output bits 13 to 16) is 0 and the column selected is (0 1 0 0)'. Input bit 12 is a '1', so the preference of the fifth column (output bits 17 to 20) is 1 and the column selected is (1 0 0 0)'. The parity of the top row of the Golay code matrix must be odd by condition 2, so the preference of the sixth column (output bits 21 to 24) is 0 and the column selected is (0 0 1 0)'.

The hereinbefore described hexacode-based multi-level encoder is not a systematic construction wherein the 12 input bits also appear as part of the 24 output bits. Since the above-discussed Golay code construction is non-systematic, the decoded information bit error probability can be higher than that of a systematic Golay code. However, this type of construction of the Golay code provides significant advantages in performance and complexity when decoded with a hexacode-based Golay decoder.

Figure 2:
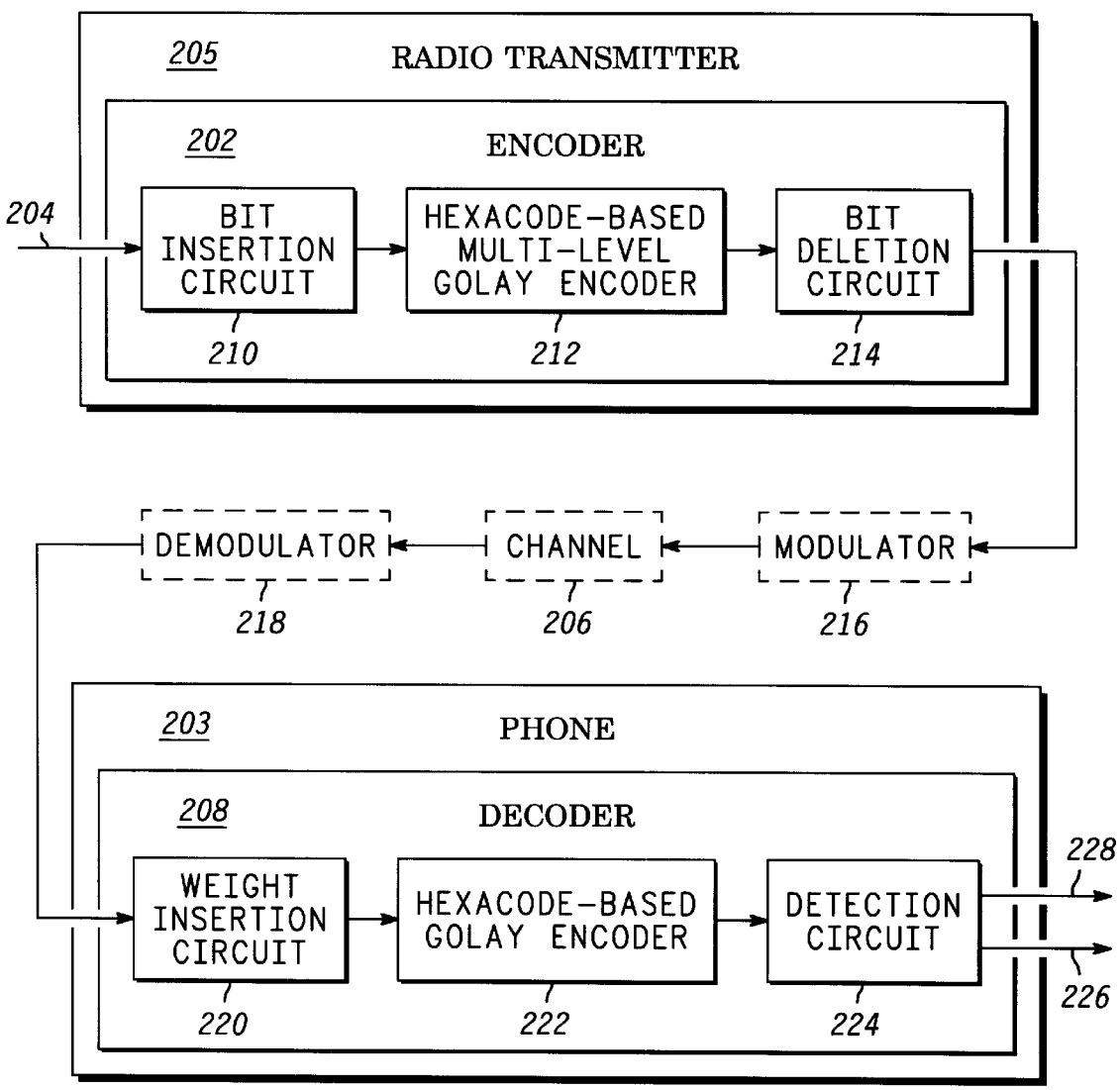
FIG. 2 is a block diagram of an embodiment of a communication system accordance with the present invention.

Referring to FIG. 2, a block diagram of an embodiment of a communication system in accordance with the present invention is illustrated. The communication system 200 provides a nonsystematically shortened code encoder 202 (hereinafter referred to as encoder) having an input 204 for receiving input digital signals and producing encoded shortened code digital signals to be transmitted over a channel 206 and received by a nonsystematically shortened code decoder 208 (hereinafter referred to as decoder). The encoder 202 and the decoder 208 of the present invention can be implemented in various electronic devices such as subscriber units/phones 203, radio transmitters 205, and the like. The encoder 202 includes a bit insertion circuit 210, a hexacode-based multi-level Golay encoder 212 coupled to the bit insertion circuit 210, and a bit deletion circuit 214 coupled to the hexacode-based multi-level Golay encoder 212. The decoder 208 includes a weight insertion circuit 220 connected to a hexacode-based Golay decoder 222, and detection circuit 224 coupled to the hexacode-based Golay decoder 222. The hexacode-based multi-level Golay encoder 212 is described above and is known in the art. The hexacode-based multi-level Golay encoder 212 provides the mapping of 12 input bits onto 24 output bits. It must be noted that in the prior art, all 24 bits are transmitted over a channel and received by a receiver utilizing a hexacode-based Golay decoder compatible with the hexacode-based multi-level Golay encoder for decoding the transmitted bits and providing data correction. In a preferred embodiment of the present invention, however, packets of information bits having preselected sizes from 1 to 11 bits can be supplied to the encoder 202, As mentioned above, the hexacode-based multi-level Golay encoder 212 requires 12 input bits. In the preferred embodiment of the present invention, depending upon the size of the packet of information, a first predetermined number of bits are inserted by the bit insertion circuit 214 into the packet of information bits having the preselected size at preselected positions in the packet of information bits, in order to provide the required 12 bits for supplying to the hexacode-based multi-level Golay encoder 212. The hexacode-based multi-level Golay encoder 212 maps the 12 bits onto 24 bits. According to the present invention, the 24 bits of output from the hexacode-based multi-level Golay encoder 212 are supplied to the bit deletion circuit 214, wherein a second predetermined number of bits, namely L number of bits, are deleted from the 24 output bits, thereby providing 24-L number of nonsystematically encoded shortened code digital signals.

As an example of the operation of the bit insertion circuit 210 and bit deletion circuit 214, consider the preferred columns (shown in TABLE A) given for the characters in GF{4} encoding example above. There are eight columns in the table (one even and one odd) for each of the four characters. There are two choices for each column because there are exactly two even columns that project to each character and two odd columns that project to each character. Therefore, there are $2^8=256$ possible ways of selecting the table. Once the mapping is selected, the same mapping is used within the hexacode-based multi-level Golay encoder and hexacode-based Golay decoder. The encoding method in the Encoding example above is a preferred method because it has a smaller decoded information bit-error-rate than some of the other mappings, though still not as small as a decoded information bit-error-rate corresponding to a systematic encoding. The implementation of the bit insertion circuit 210 and bit deletion circuit 214 depend on how the hexacode-based multilevel Golay encoder operates, including the choice of preferred columns. Using the encoding method in the Encoding example above, if input bit 8 is set to either 0 or 1 i.e., fixed to values of either 0 or 1, then the output bit 1 will also be set (fixed) to the same value. The reason is that under the encoding method of the Encoding example, all 8 preferred columns have a 0 in their first position. Hence, regardless of the character associated with the column, and regardless of whether the codeword is even or odd, output bit 1 will always be fixed when input bit 8 is fixed. Output bits that are fixed do not have to be transmitted because their value is known. The bit insertion circuit 210 in this case would take packets of 11 information bits, and insert a fixed bit as the eighth bit of a packet of 12 bits supplied to the hexacode-based multilevel Golay encoder 212. The packet of 12 bits is encoded to 24 bits, and the first bit is removed by the bit deletion circuit 214. Accordingly, 23 bits are modulated and transmitted over the channel, for an overall code rate of 11/23. Several other formats for the bit insertion and bit deletion circuits are given in the TABLE B below; the table is not exhaustive, but rather shows several codes with rates between R=1/2 and R=1/3.

TABLE B

| inserted bits | deleted bits | code rate |
| --- | --- | --- |
| 8 | 1 | 11/23 |
| 7, 8 | 1 | 10/23 |
| 8, 9 | 1, 5 | 10/22 |
| 7, 8, 9 | 1, 5 | 9/22 |
| 8, 9, 10 | 1, 5, 9 | 9/21 |
| 7, 8, 9, 10 | 1, 5, 9 | 8/21 |
| 8, 9, 10, 11 | 1, 5, 9, 13 | 8/20 |
| 7, 8, 9, 10, 11 | 1, 5, 9, 13 | 7/20 |
| 8, 9, 10, 11, 12 | 1, 5, 9, 13, 17 | 7/19 |
| 7, 8, 9, 10, 11, 12 | 1, 5, 9, 13, 17, 21 | 6/18 = 1/3 |

The nonsystematically encoded shortened code digital signals are modulated through modulator 216 and transmitted over the channel 206 and received by demodulator 218. The demodulator 218 provides either hard or soft values representative of the received nonsystematically encoded shortened code digital signals to the decoder 208. In the present invention, the values provided by the demodulator 218 are preferably soft values and the decoder 208 is preferably a soft-decision decoder. The weight insertion circuit 220 being coupled to the demodulator 218 is arranged to provide predetermined weights corresponding to the second predetermined number of bits deleted through the deletion circuit 214.

The hexacode-based Golay decoder 222 receives 24 values (hard or soft), which are arranged in a 4×6 matrix. The hexacode-based Golay decoder 222 initially assumes that the transmitted matrix was even. For each of the six columns, the hexacode-based Golay decoder 222 effectively computes the likelihood of each of the four possible transmitted characters, and stores the preferred implementation of the characters (indicating whether 0000 or 1111 is preferred for the 0 character, for example). For each of the 64 hexacode words, a metric is generated by adding the likelihood values of each of the characters in the hexacode word. For each hexacode word, if the top row is not the correct parity, the hexacode-based Golay decoder 222 changes the preferred implementation of the least likely character in the hexacode word, and modifies its metric accordingly. The metrics are compared, and the hexacode word with the largest metric is stored. The process is then repeated with the assumption that the transmitted matrix was odd. The hexacode-based Golay decoder 222 selects the hexacode word corresponding to either the largest even or odd metric. If a multi-level encoder was used, the information bits can then be extracted directly from the decoder (the best hexacode word, even or odd, and the preferred implementations of the first five columns).

In contrast to the prior art, the present invention provides a method of incorporating error detection in addition to error correction within the decoder 208. As described above, the 24-L soft values from the channel result from shortening a (24,12) Golay code output by L number of bits. Because of the non-systematic nature of the hexacode-based multi-level encoder 212, the shortening of the Golay code cannot be conveniently achieved by not transmitting L information bits. Instead, S number of bits of the 12 bits of input to the hexacode-based multi-level encoder 212 are fixed, utilizing the bit insertion circuit 210, which in turn fix L number of the 24 output bits. It must be noted that S does not necessarily equal L. The 24-L number of bits are transmitted, resulting in a code of rate (12-S)/(24-L). The hexacode-based Golay decoder 222 is used with L weights replacing the L fixed values that were not transmitted. It should be noted that the sign of the L weights that replace the corresponding L fixed values is dependent on the implementation of the modulator and the demodulator in a communication system. Even though a bit corresponding to an insertion weight is deleted and not transmitted, a system designer can determine what the sign of the demodulated value associated with the deleted bit would have been and can assign the sign of the weight accordingly. The 12 bits that are produced by the hexacode-based Golay decoder 222 are the estimate of the input digital signals and are provided to the error detection circuit 224. The error detection circuit 224 transmits the estimate of the input digital signals 228 and also provides an error detection flag 226 according to a predetermined function f( ) of the S decoded bits that correspond to the S fixed input bits. For example, the error detection circuit 224 could flag an error if any of the bits that correspond to the S fixed input bits are decoded incorrectly, or in the alternative if the majority of the same are decoded incorrectly. It is to be appreciated that the function f( ) does not have to be binary valued.

Figure 3:
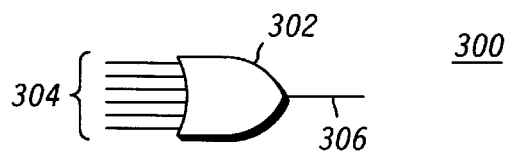
FIG. 3 is a schematic representation of a detection circuit in accordance with the present invention.

FIG. 3, numeral 300, is a schematic representation of a detection circuit in accordance with the present invention. Referring to FIG. 3, an OR gate 302 is shown wherein the OR gate 302 has six inputs 304 corresponding to the values of a preselected output bits from the hexacode-based Golay decoder 222. For example, in the event a code rate of 1/3 is to be the desired implementation of the present invention as shown in TABLE B, the values of the decoder output bits 7, 8, 9, 10, 11, and 12 are provided as the six inputs to the OR gate 302. By way of example, if the inserted bits 7,8,9,10,11, and 12 were fixed to a value of "0", then the corresponding output bits should also be fixed to a value of "0". Hence, if any of the inputs to the OR gate 302 is a "1", then the output 306 of the OR gate 302 will be a "1" which indicates that an error has occurred. An alternate detection circuit for this example could provide a soft error detection flag in accordance with the following function:

$$\text{error detection flag} = \begin{cases} 1 & bit7 = 1 \\ x/6 & x \in bit8 \ldots bit12 = 1 \\ 0 & bit7 \ldots bit12 = 0. \end{cases}$$

This soft error detection flag takes on the value zero if all the hexacode-based decoder 222 output bits that correspond to the inserted 0 bits are all 0, just like the hard-valued error detection flag. The flag takes on values closer and closer to 1 depending on the number of hexacode-based Golay decoder 222 output bits 8 through 12 that are 1, indicating that a decoding error is more likely. A error detection flag value of 1 is reached if all 6 bits (decoder output bits 7 to 12) are all 1 or if merely the hexacode-based Golay decoder 222 output bit 7 is a 1, indicating a high confidence in the decision to declare a decoding error. Output bit 7 is treated differently from output bits 8 to 12 here because it corresponds to the parity (even or odd) of the entire decoded codeword. When a decoding error is made, there is a high probability that a transmitted odd codeword will be decoded as an even codeword, and vice-versa. In view of the aforementioned high probability the status of the output bit 7 is more critical than the status of bits 8 through 12 for error detection purposes.

By setting the magnitude of weights to infinity or a very large value, the rate (12-S)/(24-L) shortened Golay code will be used entirely for correction. By lowering the magnitude of the weights (in any combination) towards zero, more detection and less correction is achieved. Thus, the amount of correction and detection is extremely flexible, and can be tailored to a particular application. The weights may also be adaptively based on estimates of the previous channel conditions.

Figure 4:
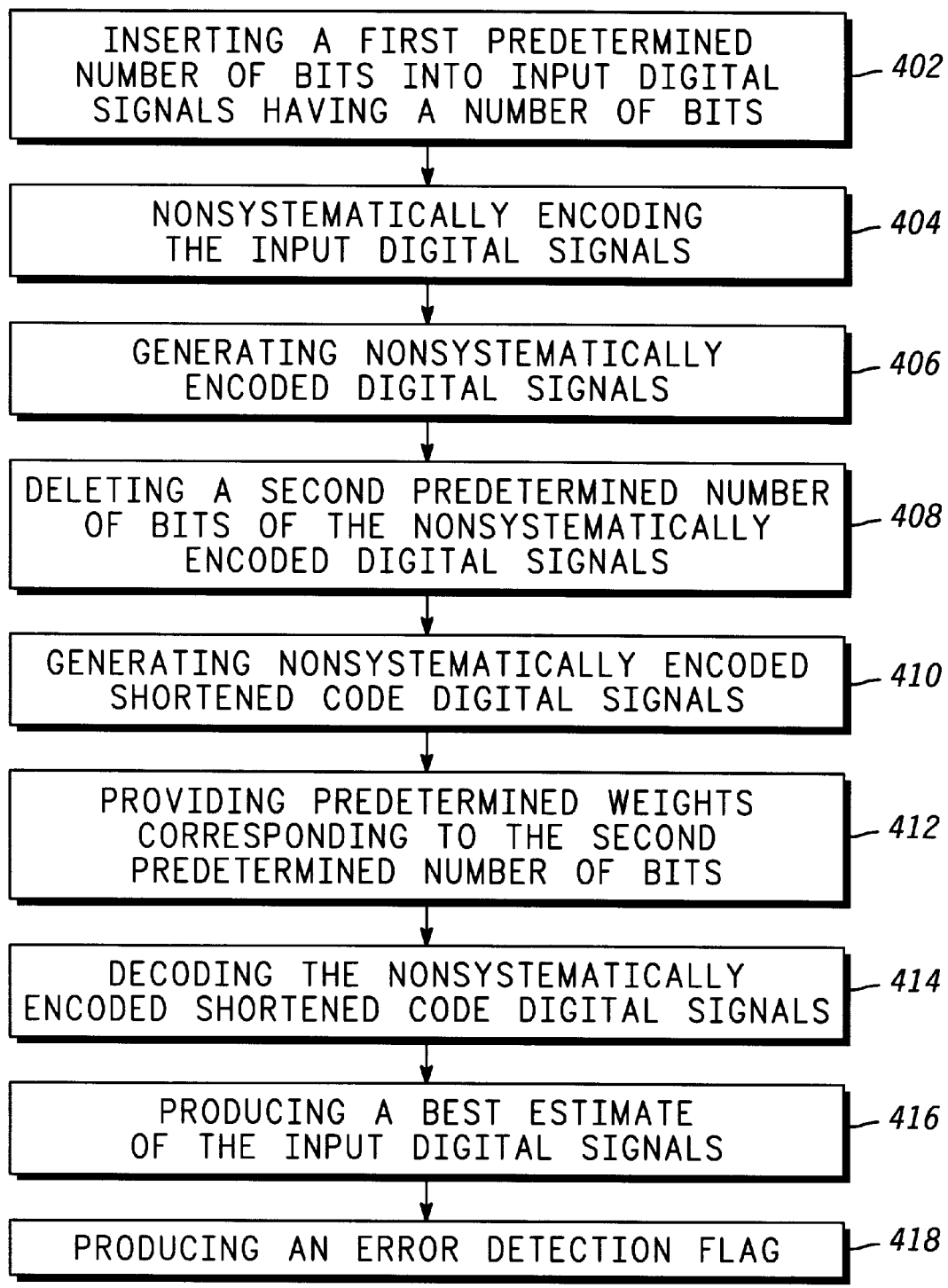
FIG. 4 is a flow chart showing one embodiment of steps in accordance with the present invention.

FIG. 4, numeral 400, is a graphic representation of one embodiment of steps of a method in accordance with the present invention. The method includes the steps of: a) inserting a first predetermined number of bits into input digital signals having a number of bits (402); b) nonsystematically encoding the input digital signals (404); c) generating nonsystematically encoded digital signals (406); d) deleting a second predetermined number of bits of the nonsystematically encoded digital signals (408); e) generating nonsystematically encoded shortened code digital signals (410); f) providing predetermined weights corresponding to the second predetermined number of bits (412); g) decoding the nonsystematically encoded shortened code digital signals (414); h) producing an estimate of the input digital signals (416); and i) producing an error detection flag (418).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

I claim:

1. A communication system, comprising:
   a nonsystematically shortened code encoder having an input adapted to receive input digital signals comprising a number of bits, wherein the nonsystematically shortened code encoder is adapted to produce encoded shortened code digital signals in accordance with the input digital signals, wherein the input digital signals do not appear within the encoded shortened code digital signals; and
   a nonsystematically shortened code decoder adapted to receive the encoded shortened code digital signals, wherein the nonsystematically shortened code decoder is adapted to produce an estimate of the input digital signals and an error detection flag.

2. The communication system of claim 1, wherein the nonsystematically shortened code encoder comprises:
   a bit insertion circuit for inserting a first predetermined number of bits into the input digital signals;
   an encoder coupled to the bit insertion circuit for producing encoded digital signals; and
   a bit deletion circuit coupled to the encoder for deleting a second predetermined number of bits of the encoded digital signals thereby generating the encoded shortened code digital signals.

3. The communication system of claim 2, wherein the nonsystematically shortened code decoder comprises:
- a weight insertion circuit for receiving values defining the encoded shortened code digital signals and providing predetermined weights corresponding to the second predetermined number of bits;
- a decoder coupled to the weight insertion circuit, receiving the values defining the encoded shortened code digital signals and the predetermined weights corresponding to the second predetermined number of bits; and
- a detection circuit coupled to the decoder for producing the estimate of said input digital signals and the error detection flag.

4. The communication system of claim 2, wherein the encoder is a hexacode-based multilevel Golay encoder.

5. The communication system of claim 1, wherein the decoder is a hexacode-based Golay decoder.

6. The communication system of claim 1, wherein the decoder is a soft-decision decoder.

7. The communication system of claim 1, wherein the decoder is a hard-decision decoder.

8. The communication system of claim 1, wherein the error detection flag is hard-valued.

9. The communication system of claim 1, wherein the error detection flag is soft-valued.

10. A method comprising the steps of:
- inserting a first predetermined number of bits into input digital signals having a number of bits;
- nonsystematically encoding the input digital signals;
- generating nonsystematically encoded digital signals;
- deleting a second predetermined number of bits of the nonsystematically encoded digital signals;
- generating nonsystematically encoded shortened code digital signals;
- providing predetermined weights corresponding to the second predetermined number of bits;
- decoding the nonsystematically encoded shortened code digital signals;
- producing an estimate of the input digital signals; and
- producing an error detection flag.

11. A radio transmitter, comprising:
- a nonsystematically shortened code encoder having an input adapted to receive input digital signals comprising a number of bits, wherein the nonsystematically shortened code encoder is adapted to produce encoded shortened code digital signals in accordance with the input digital signals, wherein the nonsystematically shortened code encoder comprises:
  - a bit insertion circuit for inserting a first predetermined number of bits into the input digital signals;
  - an encoder coupled to the bit insertion circuit for producing encoded digital signals; and
  - a bit deletion circuit coupled to the encoder for deleting a second predetermined number of bits of the encoded digital signals thereby generating the encoded shortened code digital signals.

12. The radio transmitter of claim 11, wherein the encoder is a hexacode-based multilevel Golay encoder.

13. A phone, comprising:
- a nonsystematically shortened code decoder adapted to receive encoded shortened code digital signals from an encoder responsive to input digital signals, and wherein the nonsystematically shortened code decoder is adapted to produce an estimate of the input digital signals and an error detection flag, wherein the nonsystematically shortened code decoder comprises:
  - a weight insertion circuit for receiving values defining the encoded shortened code digital signals and providing predetermined weights corresponding to a predetermined number of bits deleted in the encoded shortened code digital signals;
  - a decoder coupled to the weight insertion circuit, receiving the values defining the encoded shortened code digital signals and the predetermined weights corresponding to the predetermined number of bits deleted in the encoded shortened code digital signals; and
  - a detection circuit coupled to the decoder for producing the estimate of said input digital signals and the error detection flag.

14. The phone of claim 13, wherein the decoder is a hexacode-based Golay decoder.

15. The phone of claim 13, wherein the decoder is a soft-decision decoder.

16. The phone of claim 13, wherein the decoder is a hard-decision decoder.

17. The phone of claim 13, wherein the error detection flag is hard-valued.

18. The phone of claim 13, wherein the error detection flag is soft-valued.

* * * * *